(12) United States Patent
Suto

(10) Patent No.: US 12,294,800 B2
(45) Date of Patent: May 6, 2025

(54) SOLID-STATE IMAGING ELEMENT

(71) Applicant: SONY SEMICONDUCTOR SOLUTIONS CORPORATION, Kanagawa (JP)

(72) Inventor: Hiroki Suto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 141 days.

(21) Appl. No.: 18/256,353

(22) PCT Filed: Nov. 9, 2021

(86) PCT No.: PCT/JP2021/041183
§ 371 (c)(1),
(2) Date: Jun. 7, 2023

(87) PCT Pub. No.: WO2022/130832
PCT Pub. Date: Jun. 23, 2022

(65) Prior Publication Data
US 2024/0022837 A1    Jan. 18, 2024

(30) Foreign Application Priority Data
Dec. 17, 2020 (JP) ................................ 2020-209606

(51) Int. Cl.
*H04N 25/77* (2023.01)
*H01L 27/146* (2006.01)
(Continued)

(52) U.S. Cl.
CPC ........... *H04N 25/77* (2023.01); *H04N 25/709* (2023.01)

(58) Field of Classification Search
CPC .... H04N 25/618; H04N 25/709; H04N 25/77; H04N 25/78; H03M 1/56; H01L 27/146
See application file for complete search history.

(56) References Cited

U.S. PATENT DOCUMENTS

| 11,310,453 B2* | 4/2022 | Takada | H04N 25/60 |
| 12,063,446 B2* | 8/2024 | Oosako | H04N 25/75 |

(Continued)

FOREIGN PATENT DOCUMENTS

| JP | 2007-019682 A | 1/2007 |
| JP | 2007-251325 A | 9/2007 |

(Continued)

OTHER PUBLICATIONS

International Search Report and Written Opinion of PCT Application No. PCT/JP2021/041183, issued on Jan. 25, 2022, 08 pages of ISRWO.

*Primary Examiner* — Marly S Camargo
(74) *Attorney, Agent, or Firm* — CHIP LAW GROUP

(57) ABSTRACT

Provided is a solid-state imaging element capable of thinning out the number of operations of AD conversion units while suppressing an influence of a noise component on the AD conversion units of other columns. A solid-state imaging element according to the present embodiment includes: a plurality of comparators that is provided corresponding to a plurality of pixel columns each including an array of a plurality of pixels that photoelectrically converts light and outputs a pixel signal, and compares the pixel signal with a reference signal; a reference signal generation unit that generates a common reference signal used to generate the reference signal, and a plurality of input circuits respectively corresponding to the plurality of pixel columns and provided between the plurality of comparators and the reference signal generation unit; a common input wiring through which the common reference signal is input to the plurality of input circuits; and a common output wiring that outputs the reference signal from the plurality of input circuits to the plurality of comparators, in which each of the plurality of input circuits includes: a first transistor having a gate con- (Continued)

nected to the common input wiring; and a first switch connected between a source of the first transistor and the common output wiring.

8 Claims, 15 Drawing Sheets

(51) Int. Cl.
*H03M 1/56* (2006.01)
*H04N 25/618* (2023.01)
*H04N 25/709* (2023.01)
*H04N 25/78* (2023.01)

(56) References Cited

U.S. PATENT DOCUMENTS

| | | | | |
|---|---|---|---|---|
| 2006/0097902 | A1* | 5/2006 | Muramatsu | H03M 1/1023 341/155 |
| 2007/0008206 | A1* | 1/2007 | Tooyama | H03M 1/08 341/163 |
| 2007/0216564 | A1* | 9/2007 | Koseki | H04N 25/78 341/155 |
| 2013/0215303 | A1* | 8/2013 | Ueno | H03K 5/2481 348/300 |
| 2020/0314360 | A1* | 10/2020 | Sakai | H03M 1/162 |

FOREIGN PATENT DOCUMENTS

| | | |
|---|---|---|
| JP | 2020-120307 A | 8/2020 |
| JP | 2020-167544 A | 10/2020 |

* cited by examiner

SOLID-STATE IMAGING ELEMENT

CROSS REFERENCE TO RELATED APPLICATIONS

This application is a U.S. National Phase of International Patent Application No. PCT/JP2021/041183 filed on Nov. 9, 2021, which claims priority benefit of Japanese Patent Application No. JP 2020-209606 filed in the Japan Patent Office on Dec. 17, 2020. Each of the above-referenced applications is hereby incorporated herein by reference in its entirety.

TECHNICAL FIELD

The present disclosure relates to a solid-state imaging element.

BACKGROUND ART

In a complementary metal oxide semiconductor (CMOS) image sensor, an analog pixel signal photoelectrically converted by a plurality of pixels arranged in a pixel array unit is converted into a digital signal in an analog-to-digital (AD) conversion unit. When AD converting a pixel signal, the AD conversion unit compares the pixel signal with a linearly changing reference signal, and counts a time until the reference signal crosses the pixel signal. The AD conversion unit converts the pixel signal into a digital value on the basis of the count value.

The AD conversion unit is provided corresponding to a pixel column (hereinafter, also referred to as a column) including a plurality of pixels, and a reference signal line is connected to each AD conversion unit of the plurality of columns as a common wiring. Therefore, when a noise component caused by the inversion of the comparator, the fluctuation of the voltage of the power supply, or the like rides on the reference signal, the noise component enters the AD conversion units of the surrounding columns via the reference signal line, and streaks may occur in the image.

In order to cope with this, it is conceivable to provide a source follower circuit in the reference signal input unit of each AD conversion unit so that the noise component of the reference signal does not enter the AD conversion units of other columns. However, in this case, it is difficult to reduce power consumption by reducing the number of output columns as in the live view mode or the like.

CITATION LIST

Patent Document

Patent Document 1: Japanese Patent Application Laid-Open No. 2007-019682
Patent Document 2: Japanese Patent Application Laid-Open No. 2007-251325

SUMMARY OF THE INVENTION

Problems to be Solved by the Invention

Provided is a solid-state imaging element capable of thinning out the number of operations of AD conversion units while suppressing an influence of a noise component on the AD conversion units of other columns.

Solutions to Problems

A solid-state imaging element according to one aspect of the present disclosure includes: a plurality of comparators that is provided corresponding to a plurality of pixel columns each including an array of a plurality of pixels that photoelectrically converts light and outputs a pixel signal, and compares the pixel signal with a reference signal; a reference signal generation unit that generates a common reference signal used to generate the reference signal, and a plurality of input circuits respectively corresponding to the plurality of pixel columns and provided between the plurality of comparators and the reference signal generation unit; a common input wiring through which the common reference signal is input to the plurality of input circuits; and a common output wiring that outputs the reference signal from the plurality of input circuits to the plurality of comparators, in which each of the plurality of input circuits includes: a first transistor having a gate connected to the common input wiring; and a first switch connected between a source of the first transistor and the common output wiring.

A back gate and the source of the first transistor are electrically connected.

A back gate of the first transistor and the common output wiring are electrically connected.

The first transistor of each of the plurality of input circuits is provided in a different well diffusion layer, and the source of the first transistor is electrically connected to the well diffusion layer in which the first transistor is provided.

A plurality of the first transistor of the plurality of input circuits is provided in a same common well diffusion layer, and the common output wiring is electrically connected to the common well diffusion layer.

The first switch of an input circuit of the plurality of input circuits corresponding to a selected part of the plurality of pixel columns is turned on.

Each of the plurality of input circuits includes: a current source that supplies a current to the source of the first transistor; and a second switch connected between the source of the first transistor and the current source.

The second switch of an input circuit of the plurality of input circuits corresponding to a selected part of the plurality of pixel columns is turned on.

In each of the plurality of input circuits, the second switch is in an on state when the first switch is in an on state, and the second switch is in an off state when the first switch is in an off state.

A plurality of the common input wiring is provided corresponding to the first transistor of each of the plurality of input circuits, and transmits common reference signals having different voltages.

A first input circuit among the plurality of input circuits includes: a first current source that supplies a first current to the source of the first transistor; and a first bias line that is connected to the first current source and provides a first bias corresponding to the first current to the first current source, and a second input circuit among the plurality of input circuits includes: a second current source that supplies a second current to the source of the first transistor; and a second bias line that is connected to the second current source and provides a second bias corresponding to the second current to the second current source.

The first switch of an input circuit of the plurality of input circuits corresponding to a first pixel column intermittently selected among the plurality of pixel columns is turned on, and the first switch of an input circuit of the plurality of input circuits corresponding to a second pixel column other than the first pixel column is turned off.

The second switch of an input circuit of the plurality of input circuits corresponding to a first pixel column intermittently selected among the plurality of pixel columns is turned on, and the second switch of an input circuit of the plurality of input circuits corresponding to a second pixel column other than the first pixel column is turned off.

An input circuit of the plurality of input circuits is a source follower circuit.

MODE FOR CARRYING OUT THE INVENTION

Figure 1:
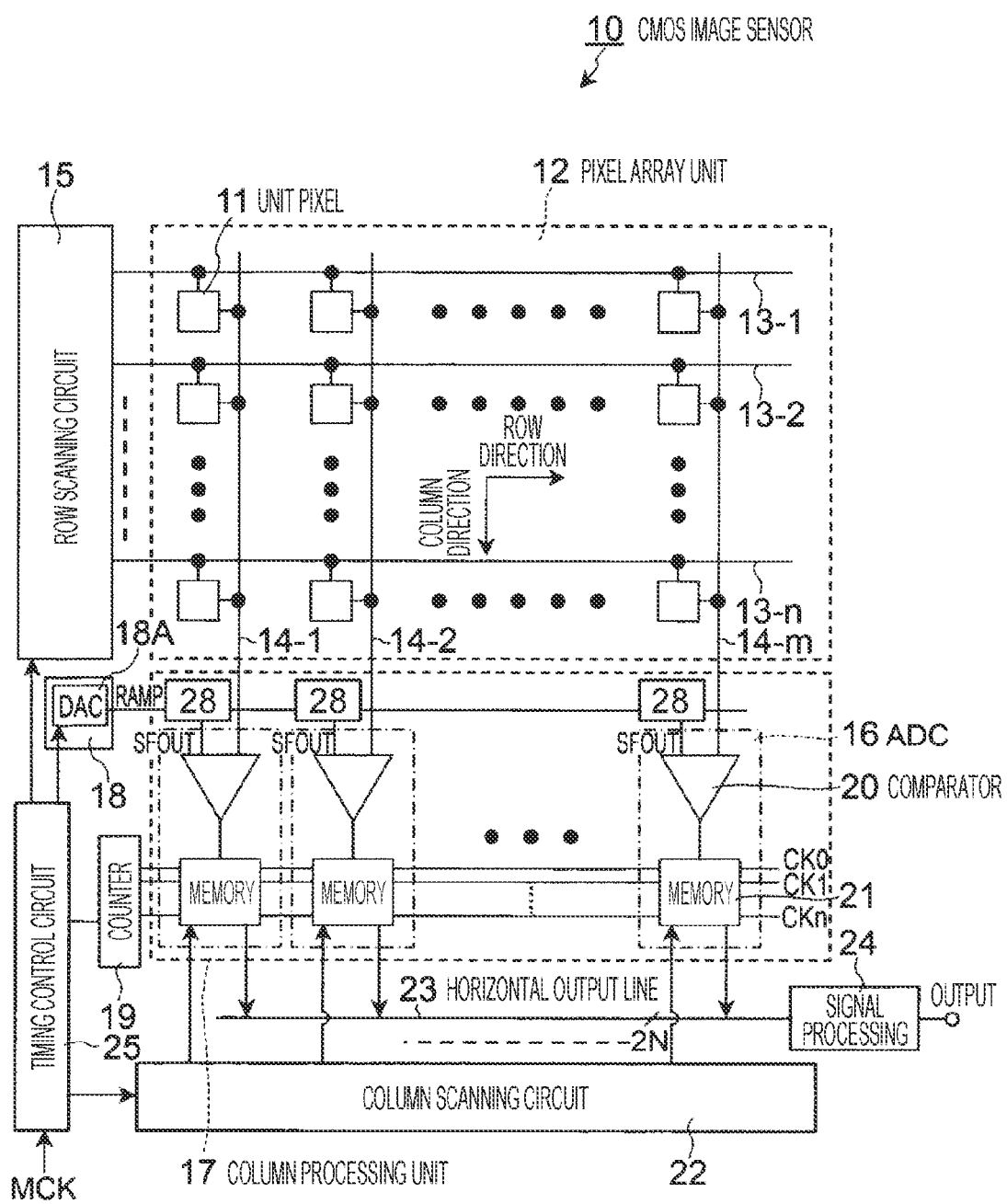
FIG. 1 is a block diagram illustrating a configuration example of a solid-state imaging element according to a first embodiment.

Hereinafter, specific embodiments to which the present technology is applied will be described in detail with reference to the drawings. The drawings are schematic or conceptual, and the ratio of each portion and the like are not necessarily the same as actual ones. In the specification and the drawings, similar elements as those described above with respect to the previously described drawings are denoted by the same reference numerals, and the detailed description thereof is appropriately omitted.

First Embodiment

FIG. 1 is a block diagram illustrating a configuration example of a solid-state imaging element according to a first embodiment. The solid-state imaging element 10 is, for example, a complementary metal oxide semiconductor (CMOS) image sensor. The solid-state imaging element 10 includes a pixel array unit 12, a row scanning circuit 15, a column processing unit 17, a reference signal generation unit 18, a counter 19, a column scanning circuit 22, a signal processing circuit 24, a timing control circuit 25, and a reference signal input circuit 28.

The pixel array unit 12 includes a plurality of unit pixels (hereinafter, also referred to as a pixel) 11 two-dimensionally arranged in a matrix. The plurality of unit pixels 11 includes a photodiode, an amplifier transistor, a transfer transistor, a selection transistor, a reset transistor, and the like, photoelectrically converts incident light, and outputs a pixel signal. For the pixel arrangement of n rows and m columns of the pixel array unit 12, row control lines 13 (13-1, 13-2, . . . , 13-n) are wired for each row, and column signal lines 14 (14-1, 14-2, . . . , 14-m) are wired for each column. Hereinafter, the plurality of pixels 11 arranged in the row direction is referred to as a pixel row. The plurality of pixels 11 arranged in the column direction is referred to as a pixel column.

The row scanning circuit 15 selectively controls each pixel row via the row control lines 13-1 to 13-n by controlling the row address and row scanning of the pixel array unit 12. The row control lines 13-1 to 13-n are provided corresponding to the respective pixel rows, and are connected to the plurality of pixels 11 included in the corresponding pixel rows. The column signal lines 14-1 to 14-m transmit pixel signals from the pixel row selected by the row scanning circuit 15 to an AD converter (hereinafter, also referred to as ADC) 16. The column signal lines 14-1 to 14-m are provided corresponding to the respective pixel columns, and are connected to the plurality of pixels 11 included in the corresponding pixel columns.

The column processing unit 17 is provided corresponding to each of the column signal lines 14-1 to 14-m, and includes a plurality of ADCs 16 connected to one ends of the column signal lines 14-1 to 14-m. The reference signal generation unit 18 generates a common reference signal RAMP having a ramp waveform, and supplies the common reference signal RAMP to the plurality of reference signal input circuits 28 in common. The common reference signal RAMP is used to generate a reference signal for detecting a voltage level of the pixel signal. The reference signal generation unit 18 includes, for example, a digital-to-analog converter (hereinafter, also referred to as a digital-to-analog converter (DAC)) 18A. The DAC 18A generates a slope-shaped waveform signal that changes substantially linearly as the common reference signal.

The reference signal input circuit 28 as an input circuit is provided corresponding to each pixel column, and is connected between the reference signal generation unit 18 and a comparator 20 of the ADC 16. The reference signal input circuit 28 receives the common reference signal RAMP and supplies the reference signal SFOUT to the comparator 20 of each ADC 16.

The counter 19 measures a period during which the comparison operation is performed by the comparator 20 by performing the counting operation in synchronization with the clock CK of the predetermined cycle. The counter 19 measures a period from the start of the slope of the voltage Vref of the reference signal SFOUT until the voltage Vref of the reference signal SFOUT crosses the voltage level of the pixel signal.

The ADC 16 is provided corresponding to each pixel column and constitutes a column-parallel ADC. Each ADC 16 includes the comparator 20 and a memory 21. The comparator 20 compares the analog pixel signal obtained from the pixel 11 in the pixel row selected from the row control lines 13-1 to 13-$n$ via the column signal lines 14-1 to 14-$m$ with the voltage Vref of the reference signal SFOUT. The memory 21 holds the count value of the counter 19 in response to the comparison output of the comparator 20. As a result, the memory 21 holds the count value from the start of the slope of the voltage Vref of the reference signal until the voltage Vref crosses the voltage level of the pixel signal. This count value is a value obtained by converting an analog pixel signal into a digital signal. That is, the ADC 16 converts the analog pixel signal into a digital signal by comparing the analog pixel signal with the voltage Vref of the reference signal SFOUT.

The column scanning circuit 22 reads the digital values from the memory 21 of the ADC 16 in the order of the columns by controlling the column address and the column scanning of the ADC 16. For example, the N-bit digital signal AD-converted by the ADC 16 is sequentially read to a horizontal output line 23 having a width of 2N bits by column scanning by the column scanning circuit 22 and transmitted to the signal processing circuit 24 by the horizontal output line 23. The signal processing circuit 24 includes 2N sense circuits, subtraction circuits, output circuits, and the like corresponding to the horizontal output line 23 having a 2N-bit width, and processes a digital signal.

The timing control circuit 25 generates a clock signal and a timing signal necessary for each operation of the row scanning circuit 15, the ADC 16, the reference signal generation unit 18, the reference signal input circuit 28, the counter 19, the column scanning circuit 112, and the like on the basis of the master clock MCK. The timing control circuit 25 supplies the clock signal and the timing signal to the corresponding circuit portion.

Next, a basic operation of the solid-state imaging element 10 according to the present embodiment will be described.

Figure 2:
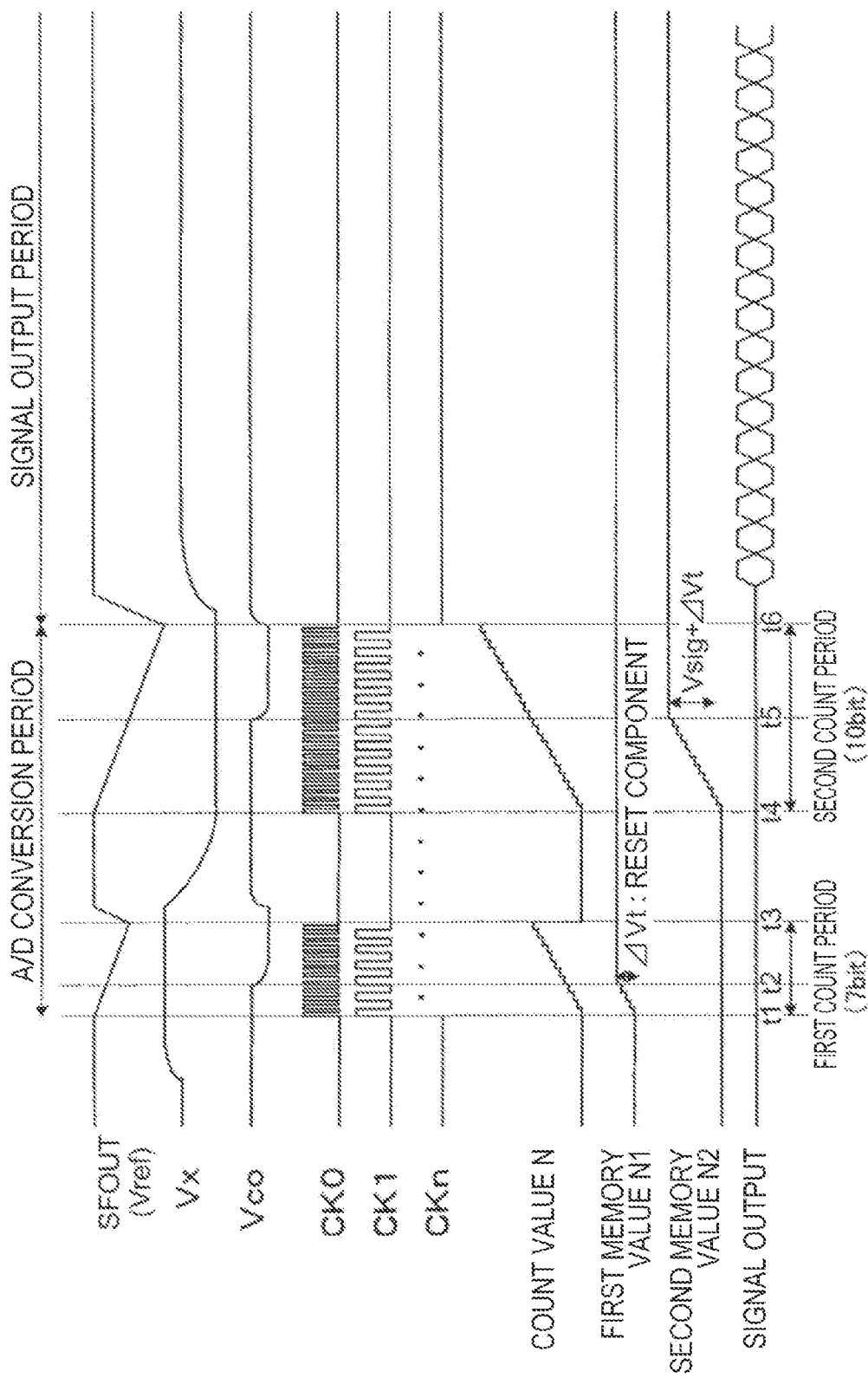
FIG. 2 is a timing chart illustrating an example of basic operation of the solid-state imaging element according to the first embodiment.

FIG. 2 is a timing chart illustrating an example of basic operation of the solid-state imaging element according to the first embodiment. After the first read operation from the pixel 11 included in the selected pixel row to the column signal lines 14-1 to 14-$m$ is stabilized, at t1, the common reference signal RAMP is provided from the DAC 18A to the reference signal input circuit 28, and the reference signal input circuit 28 provides the reference signal SFOUT to the comparator 20. The DAC 18A decreases the voltage of the common reference signal RAMP substantially linearly. Accordingly, the voltage Vref of the reference signal SFOUT of the reference signal input circuit 28 decreases substantially linearly from a voltage higher than the pixel signal. As a result, the comparator 20 performs a comparison operation between the voltage Vx of the pixel signals of the column signal lines 14-1 to 14-$m$ and the voltage Vref of the reference signal SFOUT. In the comparison operation, when the voltage Vref of the reference signal SFOUT becomes equal to the voltage Vx of the pixel signal (when crossing: t2), the polarity of the comparison output Vco of the comparator 20 is inverted. The counter 19 counts periods t1 to t2 from the start of the change in the voltage Vref of the reference signal SFOUT to the polarity inversion of the comparison output Vco. In response to the inverted output of the comparator 20, the count value N1 of the counter 19 corresponding to the comparison times t1 to t2 in the comparator 20 is held in the memory 21.

In the first read operation, the reset component ΔVt of the pixel 11 is read. In the reset component ΔVt, fixed pattern noise (dark current component) varying for each pixel 11 is included as an offset. However, since the variation of the reset component ΔVt is generally small and the reset level is common to all the pixels, the signal voltage Vx of the pixel n of the column signal line 14 at the time of the first reading is approximately known. Therefore, at the time of reading the reset component ΔVt for the first time, the comparison period in the comparator 20 can be shortened by adjusting the voltage Vref of the reference signal SFOUT. For example, in the present embodiment, the reset component ΔVt is compared in a count period (128 clocks) corresponding to 7 bits. The count value N1 is a digital value including only a dark current component of the pixel 11 in the reset state.

In the second reading, in addition to the reset component ΔVt, reading of a signal component corresponding to incident light for each pixel 11 is performed by an operation similar to that in the first reading. That is, after the second read operation from the pixel 11 included in the selected pixel row to the column signal lines 14-1 to 14-$m$ is stabilized, the reference signal input circuit 28 provides the reference signal SFOUT to the comparator 20 at t4. The comparator 20 performs a comparison operation between the voltage Vx of the pixel signals of the column signal lines 14-1 to 14-$m$ and the voltage Vref of the reference signal SFOUT. In the comparison operation, when the voltage Vref of the reference signal SFOUT becomes equal to the voltage Vx of the pixel signal (when crossing: t5), the polarity of the comparison output Vco of the comparator 20 is inverted. The counter 19 counts a period t4 to t5 from the start of the change in the voltage Vref of the reference signal SFOUT to the polarity inversion of the comparison output Vco. In response to the inverted output of the comparator 20, the count value N2 of the counter 19 corresponding to the comparison times t4 to t5 in the comparator 20 is held in the memory 21. The count value N1 is a digital value including a dark current component and a signal component corresponding to incident light. The first count value N1 and the second count value N2 are held in different places in the memory 21.

After completion of the series of AD conversion operations described above, N-bit digital signals for the first time and the second time held in the memory 21 are supplied to the signal processing circuit 24 via the 2N horizontal output lines 23 by column scanning by the column scanning circuit 112. A subtraction circuit (not illustrated) in the signal processing circuit 24 performs subtraction processing of (second signal)−(first signal), that is, correlated double sampling (CDS) processing. Thereafter, the digital signal after the CDS processing is output to the outside. A two-dimensional image is generated by sequentially repeating a similar operation for each row.

As described above, the solid-state imaging element 10 performs AD conversion into a digital signal by comparing the analog pixel signal obtained via the column signal lines 14-1 to 14-$m$ with the reference signal SFOUT. Furthermore, the solid-state imaging element 10 can obtain a digital signal of a signal level excluding a dark current component by executing CDS processing of a reset level and a signal level corresponding to incident light.

Figure 3:
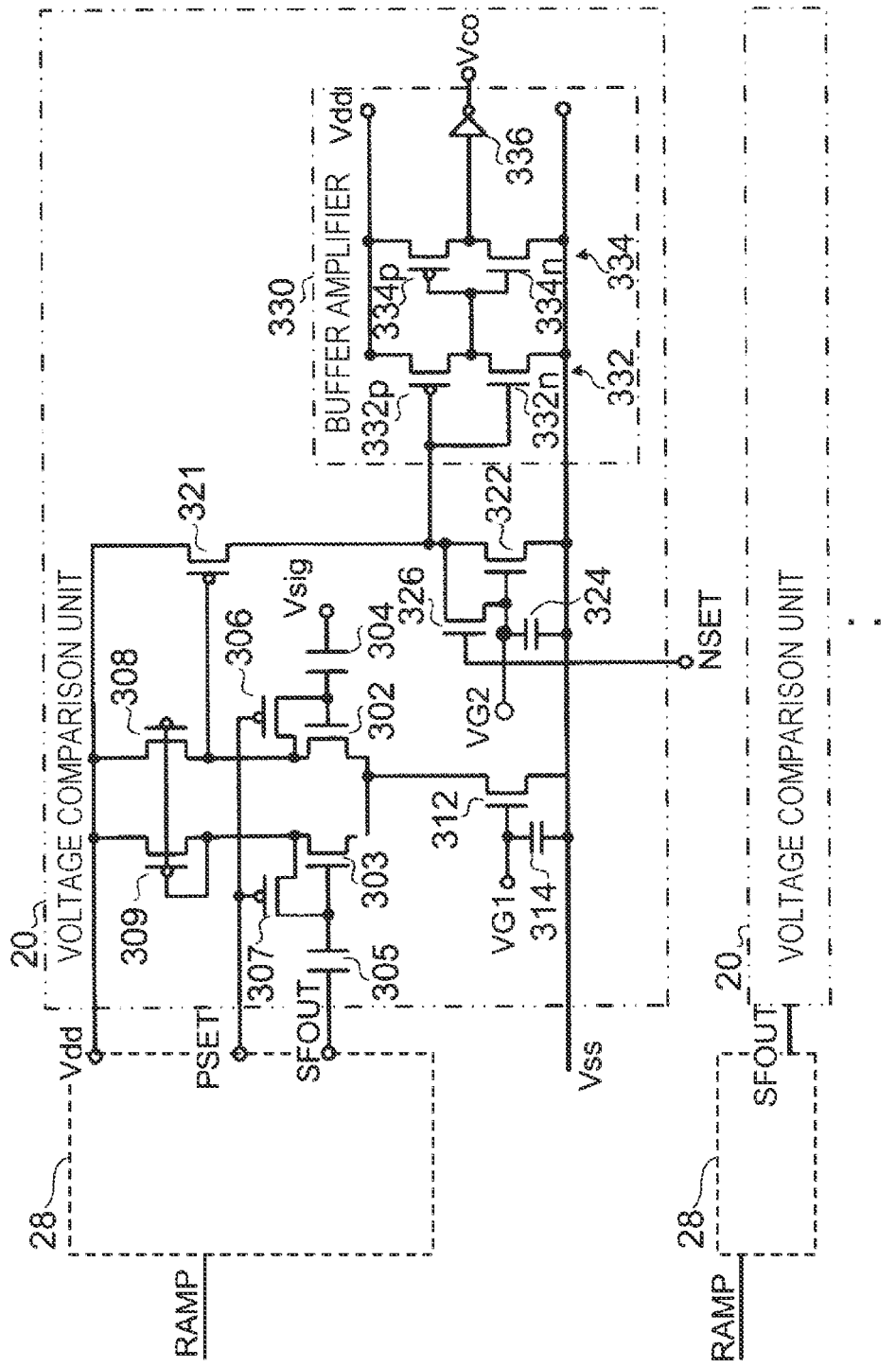
FIG. 3 is a circuit diagram illustrating a detailed configuration example of a comparator.

FIG. 3 is a circuit diagram illustrating a detailed configuration example of the comparator 20. The comparator 20 includes N-type metal oxide semiconductor (MOS) transistors 302 and 303 differentially connected to an input stage, coupling capacitors 304 and 305, and P-type MOS transistors 306 and 307 for a reset switch. The gate of the transistor 302 is connected to the column signal line 14 via the coupling capacitor 304, and the gate of the transistor 303 is connected to the output of the reference signal input circuit 28 via the coupling capacitor 305. The gates of the transistors 302 and 303 constituting the differential pair are referred to as differential input gates.

The source-drain of the transistor 306 is connected between the gate and the drain of the transistor 302. The source-drain of the transistor 307 is connected between the gate and the drain of the transistor 303. A low active reset signal PSET is applied from the timing control circuit 25 to the gate of each transistor 306 and 307.

Furthermore, the comparator 20 includes P-type MOS transistors 308 and 309 connected to the respective drain sides of the transistors 302 and 303. The sources of the transistors 308 and 309 are connected to the power supply Vdd, and the gates thereof are connected in common to constitute a current mirror circuit as a load circuit. The drain and the gate of the transistor 309 are connected to each other and also connected to the drain of the transistor 303. The drain of the transistor 308 is connected to the drain of the transistor 302.

Furthermore, the comparator 20 includes an N-type MOS transistor (load MOS transistor) 312 connected to each source side of the transistors 302 and 303. The load MOS transistor 312 defines an operation current of the transistors 302 and 303. The drain of the load MOS transistor 312 is commonly connected to each source of the transistors 302 and 303, and the source is grounded. A capacitor 314 is connected between the gate and the ground of the load MOS transistor 312. A DC gate voltage VG1 for defining an operation current is supplied from the timing control circuit 25 to the gate of the load MOS transistor 312. The load MOS transistor 312 operates as a constant current source by receiving the DC gate voltage VG1 at the gate.

The transistors 302, 303, 308, 309, and 312 constitute a differential amplifier as a whole.

The comparator 20 further includes a P-type MOS transistor 321 whose gate is connected to the output terminal of the differential amplifier, that is, the drain side of the transistor 308. The source of the transistor 321 is connected to the power supply Vdd, and the drain thereof is grounded via an N-type MOS transistor (load MOS transistor) 322. The drain of the load MOS transistor 322 is connected to the drain of the transistor 321, and the source thereof is grounded. A capacitor 324 is connected between the gate and the ground of the load MOS transistor 322. A DC gate voltage VG2 for defining an operation current is supplied from the timing control circuit 25 to the gate of the load MOS transistor 322. The load MOS transistor 322 operates as a constant current source by receiving the DC gate voltage VG2 at the gate.

The comparator 20 further includes an N-type MOS transistor 326 for a reset switch connected between the gate and the drain of the transistor 322. A high active reset signal NSET is applied from the timing control circuit 25 to the gate of the transistor 326.

The differential amplifier output derived from the drains of the transistors 321 and 322 is provided as a comparison output Vco to the memory 21 and the counter 19 of the next stage via a buffer amplifier 330 of the inversion output type. Here, the buffer amplifier 330 includes inverters 336 of a CMOS inverter 332 at the preceding stage and a CMOS inverter 334 at the subsequent stage. The CMOS inverter 332 includes a P-type MOS transistor 332p and an N-type MOS transistor 332n which are connected in series between the power supply Vdd and the ground, and have gates and drains connected in common. Similarly, the CMOS inverter 334 includes a P-type MOS transistor 334p and an N-type MOS transistor 334n connected in series between the power supply Vdd and the ground, and having gates and drains connected in common. Note that the configuration of the buffer amplifier 330 is merely an example, and for example, the buffer amplifier may include only the CMOS inverter 332 at the preceding stage.

Figure 4:
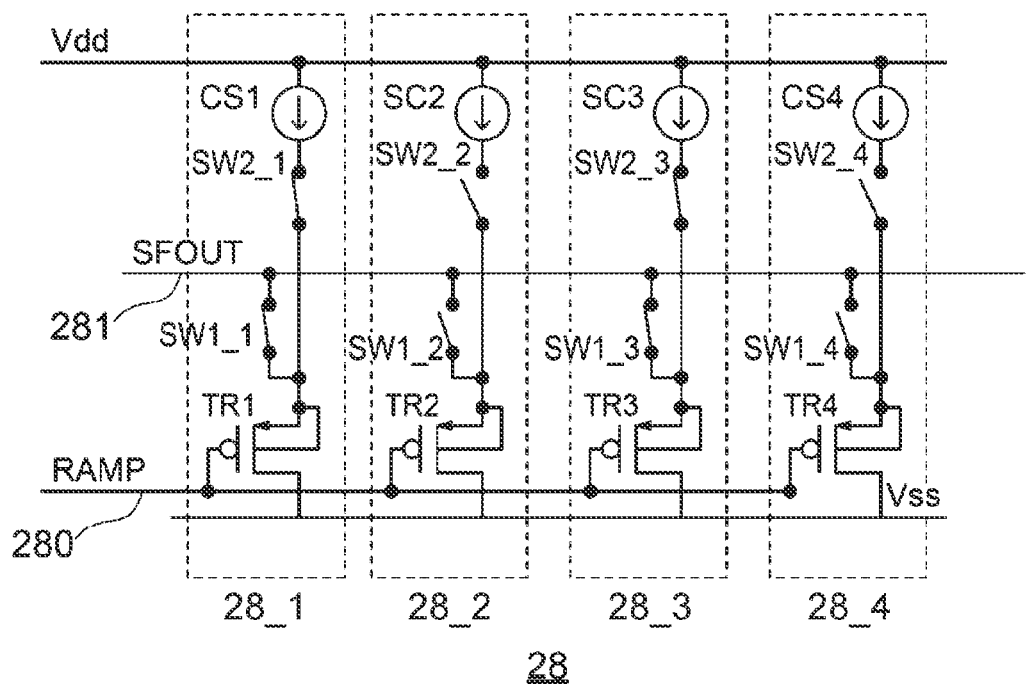
FIG. 4 is a circuit diagram illustrating an example of an internal configuration of a reference signal input circuit.

FIG. 4 is a circuit diagram illustrating an example of an internal configuration of a reference signal input circuit. The plurality of reference signal input circuits 28 corresponds to the plurality of pixel columns, respectively, and is provided between the plurality of comparators 20 and the reference signal generation unit 18. FIG. 4 illustrates four reference signal input circuits 28_1 to 28_4 corresponding to four pixel columns (columns). The number of reference signal input circuits 28 corresponds to the number of pixel columns.

The reference signal input circuits 28_1 to 28_4 are connected to the reference signal generation unit 18 via a common input wiring 280, and receive the common reference signal RAMP from the reference signal generation unit 18. The reference signal input circuits 28_1 to 28_4 are connected to the corresponding comparator 20 via a common output wiring 281, and supply the reference signal SFOUT to the comparator 20.

The solid-state imaging element 10 includes the common input wiring 280 and the common output wiring 281. The UT is supplied to the comparator 20. The common input wiring 280 connects the reference signal generation unit 18 and the reference signal input circuits 28_1 to 28_4 in order to input the common reference signal RAMP to the plurality of reference signal input circuits 28. The common input wiring 280 is provided in common with the reference signal input circuits 28_1 to 28_4. The common output wiring 281 connects the reference signal input circuits 28_1 to 28_4 and the comparator 20 in order to output the reference signal SFOUT from the plurality of reference signal input circuits 28_1 to 28_4 to the comparator 20 of each corresponding column. The common output wiring 281 is also provided in common with the reference signal input circuits 28_1 to 28_4.

Since the reference signal input circuits 28_1 to 28_4 have the same internal configuration, the internal configuration of the reference signal input circuit 28_1 will be described, and the description of the other internal configurations of the reference signal input circuit 28_2 to 28_4 will be omitted.

The reference signal input circuit 28_1 includes a first transistor TR1, a first switch SW1_1, a second switch SW2_1, and a current source CS1, the reference signal input circuit 28_1 constitutes a source follower circuit, and separates the common input wiring 280 and the common output wiring 281 from each other. As a result, even if a noise component is generated in the common reference signal RAMP of the common input wiring 280, the noise component is not transmitted to the reference signal SFOUT of the common output wiring 281.

The gate of the first transistor TR1 is connected to the common input wiring 280. The source of the first transistor TR1 is connected to the common output wiring 281 via the first switch SW1_1, and the drain thereof is connected to a low voltage source (ground) Vss. The first transistor TR1 is, for example, a P-type MOS transistor.

The back gate of the first transistor TR1 is electrically connected to the source of the first transistor TR1. As a result, the voltage of the back gate of the first transistor TR1 becomes substantially equal to the source voltage of the first transistor TR1.

The first switch SW1_1 is connected between the source of the first transistor TR1 and the common output wiring 281. The first switch SW1_1 is on/off controlled by a control signal from the timing control circuit 25.

The second switch SW2_1 is connected between the source of the first transistor TR1 and the current source CS1. The second switch SW2_1 is also on/off controlled by a control signal from the timing control circuit 25. The first and second switches SW1_1 and SW2_1 are synchronized, and are simultaneously controlled to be turned on/off. Therefore, one of the first and second switches SW1_1 and SW2_1 is in the on state, and the other is not in the off state.

The current source CS1 is connected between the high-level voltage source Vdd and the second switch SW2_1, and is configured to cause a constant current to flow from the voltage source Vdd to the source of the first transistor TR1.

The other reference signal input circuits 28_2 to 28_4 also have a similar configuration to that of the reference signal input circuit 28_1.

When the first and second switches SW1_1 and SW2_2 are turned on, the current source CS1 causes a constant current to flow through the first transistor TR1 via the second switch SW2_1. The reference signal input circuit 28_1 functions as a source follower circuit, and generates a voltage corresponding to the voltage of the common reference signal RAMP from the common input wiring 280 at the source of the first transistor TR1. The source voltage of the first transistor TR1 is transmitted to the common output wiring 281 as a reference signal SFOUT and supplied to the comparator 20 of each column.

At this time, since the back gate of the first transistor TR1 is connected to the source of the first transistor TR1, the back gate voltage of the first transistor TR1 changes together with the source voltage (the voltage of the reference signal SFOUT). Since the back gate voltage and the source voltage of the first transistor TR1 are substantially equal, the threshold voltage of the first transistor TR1 is not varied by the substrate bias effect. That is, even if the voltage of the common reference signal RAMP changes, since the fluctuation of the threshold voltage of the first transistor TR1 is very small, the linearity of the reference signal SFOUT with respect to the common reference signal RAMP is maintained. For example, when the voltage of the common reference signal RAMP changes substantially linearly, the voltage Vref of the reference signal SFOUT also changes substantially linearly by the source follower function of the first transistor TR1. As a result, the reference signal input circuit 28_1 can substantially linearly change the voltage Vref of the reference signal SFOUT similarly to the common reference signal RAMP while suppressing the entry of the noise component from the common input wiring 280 to the common output wiring 281.

The other reference signal input circuits 28_2 to 28_4 also function as source follower circuits similarly to the reference signal input circuit 28_1, and can operate similarly.

In addition, the first and second switches SW1_1 to SW1_4 and SW2_1 to SW2_4 are selectively controlled to be turned on/off. For example, the switches SW1_1, SW1_3, SW2_1, and SW2_3 of the reference signal input circuits 28_1 and 28_3 are turned on, and the switches SW1_2, SW1_4, SW2_2, and SW2_4 of the reference signal input circuits 28_2 and 28_4 are turned off. In this case, the reference signal input circuits 28_1 and 28_3 operate as source follower circuits, and the reference signal input circuits 28_2 and 28_4 do not operate.

In this manner, only the reference signal input circuits 28_1 and 28_3 corresponding to some pixel columns selected among the plurality of pixel columns may be operated. For example, in a case where the image quality is lowered and an image is projected with low power consumption as in a live view mode or the like, the solid-state imaging element 10 may intermittently operate the plurality of reference signal input circuits 28_1 to 28_n (n is an integer of 2 or more). That is, the switches SW1_(2k-1) (1≤k≤n) and SW2_(2k-1) of the reference signal input circuit 28_(2k-1) are turned on, and the switches SW1_2k and SW2_2k of the reference signal input circuit 28_(2k) are turned off. That is, the first switch SW1_(2k-1) and the second switch SW2_(2k-1) of the reference signal input circuit 28_(2k-1) corresponding to the odd-numbered pixel column intermittently selected among the plurality of pixel columns are turned on, and the first switch SW1_(2k) and the second switch SW2_(2k) of the reference signal input circuit 28_(2k) corresponding to the other pixel columns are turned off. As a result, the solid-state imaging element 10 can detect only the pixel signal from the pixel column, and can display an image with low power consumption while lowering the image quality. Note that the reference signal input circuit to be selectively operated among the reference signal input circuits 28_1 to 28_n may not be intermittent, and may be arbitrary.

Figure 5A:
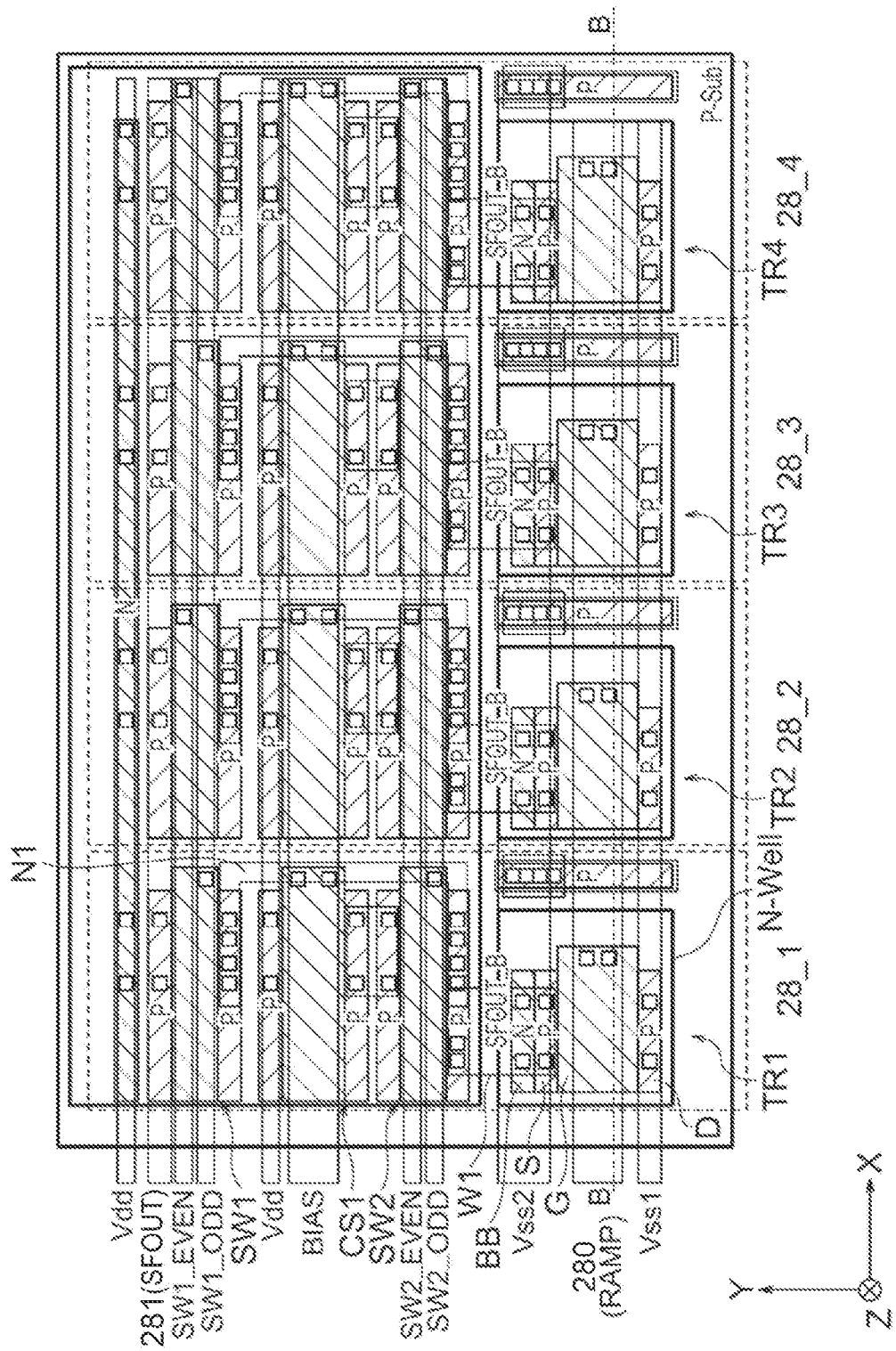
FIG. 5A is a plan view illustrating an example of a configuration of a reference signal input circuit according to the first embodiment.
Figure 5B:
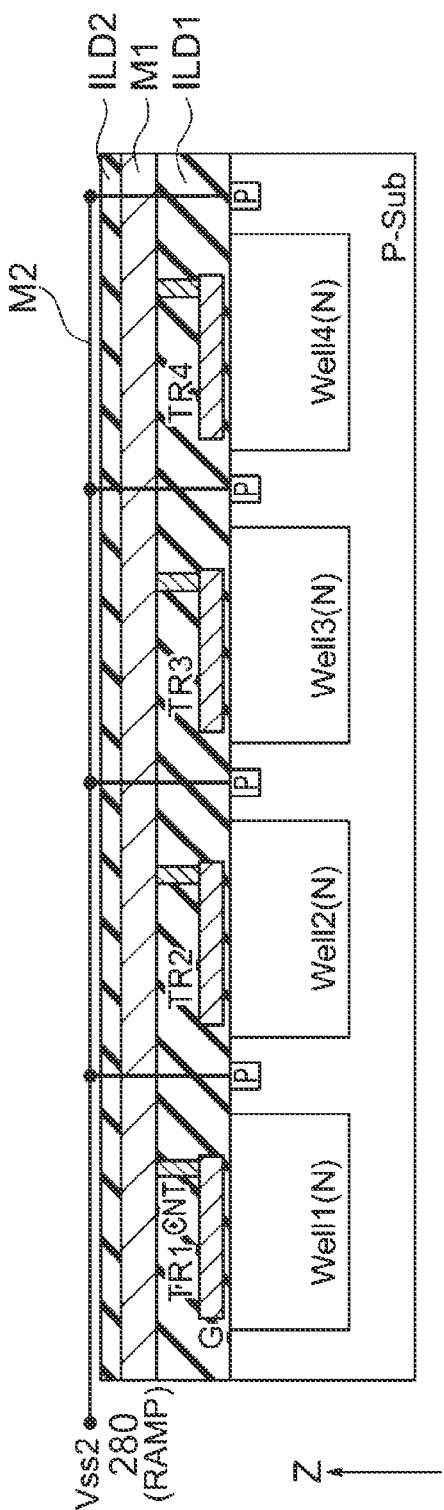
FIG. 5B is a schematic cross-sectional view taken along line B-B in FIG. 5A.

FIG. 5A is a plan view illustrating an example of a configuration of a reference signal input circuit according to the first embodiment. FIG. 5B is a schematic cross-sectional view taken along line B-B in FIG. 5A. The reference signal input circuits 28_1 to 28_4 have the same configuration as described above. Therefore, the configuration of the reference signal input circuit 28_1 will be described, and the detailed description of the configuration of the reference signal input circuit 28_2 to 28_4 will be omitted. Note that the arrangement direction of the pixels in the pixel column is the Y direction, and the arrangement direction of the pixels in the pixel row is the X direction. A direction perpendicular to the X-Y plane is defined as the Z direction.

As illustrated in FIG. 5A, power supply lines Vdd and Vss1, control signal lines SW1_EVEN, SW1_ODD, SW2_EVEN, and SW2_ODD, common input wiring 280, common output wiring 281, control lines BIAS of current sources CS1 to CS4, and wiring W1 are provided as wirings extending in the X direction. As illustrated in FIG. 5B, these wirings are formed by processing a first metal wiring layer M1 provided above the transistors TR1 to TR4 with an interlayer insulating film ILD1 interposed therebetween.

In addition, as illustrated in FIG. 5A, a power supply line Vss2 is provided as a wiring extending in the X direction. A node ND1 is provided to be connected to the source S of the first transistor TR1, the back bias BB, one end of the first switch SW1_1, and one end of the second switch SW1_2. As illustrated in FIG. 5B, the power supply line Vss2 and the node ND1 are formed by processing a second metal wiring layer M2 provided above the first metal wiring layer M1 with an interlayer insulating film ILD2 interposed therebetween.

Note that, here, Vdd, Vss1, and Vss2 may indicate corresponding power supply voltages or wirings for transmitting the power supply voltages. SW1_EVEN, SW1_ODD, SW2_EVEN, and SW2_ODD may indicate corresponding control signals or wirings for transmitting the control signals.

The first transistor TR1 is a P-type MOS transistor, and is provided in an N-type well region Well1 formed on the surface of a P-type semiconductor substrate. The N-type well region Well1 functions as a back bias BB of the first transistor TR1.

As illustrated in FIG. 5B, the common input wiring 280 is connected to the gate G of the first transistor TR1 via a contact CNT. The gate G is provided on the surface of the semiconductor substrate with a gate insulating film interposed therebetween.

The source S and the drain D of the first transistor TR1 are provided on each of one side and the other side of the gate G in the Y direction. The drain D is connected to the low voltage source Vss2. The source S is electrically connected to the back bias BB (self-bias).

The back bias BB (N-type well region) of the first transistor TR1 is electrically connected once to the second switch SW2 via the wiring W1 and is electrically connected to the node ND1. The node ND1 is connected to one end of each of the switches SW1_1 and SW2_1. That is, the node ND1 is a node electrically connected in common to the source of the first transistor TR1, the back bias BB (well region Well1), one end of the first switch SW1_1, and one end of the second switch SW2_1.

One end of the first switch SW1_1 is connected to the node ND1, and the other end is connected to the common output wiring 281. The first switch SW1_1 is provided below the control signal lines SW1_EVEN and SW1_ODD, and its gate is connected to one of the control signal lines SW1_EVEN and SW1_ODD. For example, the gate of the first switch SW1_(2k-1) of the odd-numbered column is connected to the control signal line SW1_ODD, and is not connected to the control signal line SW1_EVEN. The gate of the first switch SW1_(2k) of the even-numbered column is connected to the control signal line SW1_EVEN, and is not connected to the control signal line SW1_ODD. In this way, by dividing the odd-numbered column and the even-numbered column and dividing the control signal line to SW1_EVEN and SW1_ODD, the first switch SW1_n can be intermittently turned on/off.

Similarly, one end of the second switch SW2_1 is connected to the node ND1, and the other end is connected to one end of the current source CS1. The second switch SW2_1 is provided below the control signal lines SW2_EVEN and SW2_ODD, and its gate is connected to one of the control signal lines SW2_EVEN and SW2_ODD. For example, the gate of the second switch SW2_(2k-1) of the odd-numbered column is connected to the control signal line SW2_ODD, and is not connected to the control signal line SW2_EVEN. The gate of the second switch SW2_(2k) of the even-numbered column is connected to the control signal line SW2_EVEN, and is not connected to the control signal line SW2_ODD. In this manner, by dividing the odd-numbered column and the even-numbered column and dividing the control signal line to SW2_EVEN and SW2_ODD, the second switch SW2_n can also be intermittently turned on/off.

One end of the current source CS1 is connected to the other end of the second switch SW2, and the other end of the current source CS1 is connected to the power supply line Vdd. The gate of the power supply line CS1 is connected to the control line BIAS. The power supply line CS1 enters a conduction state corresponding to the voltage of the control line BIAS, and causes a current (constant current) corresponding to the voltage of the control line BIAS to flow.

Here, the transistors TR1 to Tr4 of the reference signal input circuits 28_1 to 28_4 according to the present embodiment are provided in different N-type well regions Well1 to Well4. The well regions Well1 to Well4 are electrically separated from each other. A P+ type diffusion layer is provided in the semiconductor substrate between the well regions Well1 to Well4 in order to be connected to the power supply line Vss2. The semiconductor substrate is maintained at the voltage of the power supply Vss via the P+ type diffusion layer.

In a case where the well regions Well1 to Well4 are formed as one well region, the sources and the back gates of the first transistors TR1 to TR4 are electrically connected. In this case, for example, when only the reference signal input circuit 28_(2k-1) of the odd-numbered column is to be operated, not only the back bias BB of the first transistor TR (2k-1) of the reference signal input circuit 28_(2k-1) but also the back bias BB of the first transistor TR (2k) of the even-numbered column are connected to the source of the first transistor TR (2k-1). Therefore, the linearity of the source voltage (reference signal SFOUT) with respect to the gate voltage (common reference signal RAMP) of the first transistor TR (2k-1) is deteriorated. That is, the operating point of the source follower circuit of the reference signal input circuit 28_(2k-1) changes.

Therefore, in the present embodiment, as illustrated in FIG. 5B, the well regions Weill to Well4 are separately and electrically separated. As a result, even when the reference signal input circuits 28_(2k-1) of some columns are operated and the other reference signal input circuits 28_(2k) are stopped, the linearity of the source voltage (reference signal SFOUT) with respect to the gate voltage (common reference signal RAMP) of the first transistor TR (2k-1) is favorably maintained. As a result, the operating point of the source follower circuit of the reference signal input circuit 28_(2k-1) is stabilized regardless of the number of reference signal input circuits to be operated or the like.

In addition, it is conceivable to selectively operate some of the reference signal input circuits 28 only with the second switch SW2 without providing the first switch SW1. In this case, the common output wiring 281 illustrated in FIG. 4 is commonly connected to the sources of the first transistors TR1 to TR4 of all the columns. In this configuration, when the second switches SW2_(2k-1) of the reference signal input circuits 28_(2k-1) of some columns are turned on and the second switches SW2_(2k) of the other reference signal input circuits 28_(2k) are turned off, the current source CS (2k-1) causes a current to flow through the first transistor TR (2k-1). Meanwhile, since the current source CS (2k) is separated from the first transistor TR (2k) by the second switch SW2_(2k), a current cannot flow through the first transistor TR (2k).

However, in this case, the current from the current source CS (2k-1) may be supplied to the source of the first transistor TR (2k-1) via the common output wiring 281. In this case, the unselected reference signal input circuit 28_(2k) that should not operate may malfunction.

Therefore, the first switch SW1 is provided between the common output wiring 281 and the source of the first transistor TR1 to prevent a current from flowing through the unselected reference signal input circuit 28_(2k). As a result, it is possible to suppress a malfunction of the unselected reference signal input circuit 28_(2k).

According to the present embodiment, since the reference signal input circuit 28_n functions as a source follower circuit, it is possible to suppress the noise component of a certain column from affecting the ADC 16 of another column. As a result, streaking in the image is suppressed. In addition, by providing the switches SW1_n and SW2_n, the number of operations of the ADC 16 can be thinned out.

The above embodiment illustrates an example in which the reference signal input circuits 28_(2k-1) of the odd-numbered columns are selectively operated. However, as a matter of course, the reference signal input circuits 28_(2k)

of the even-numbered columns may be selectively operated. In addition, the reference signal input circuit to be selectively operated among the reference signal input circuits 28_1 to 28_n may be arbitrary.

Second Embodiment

Figure 6:
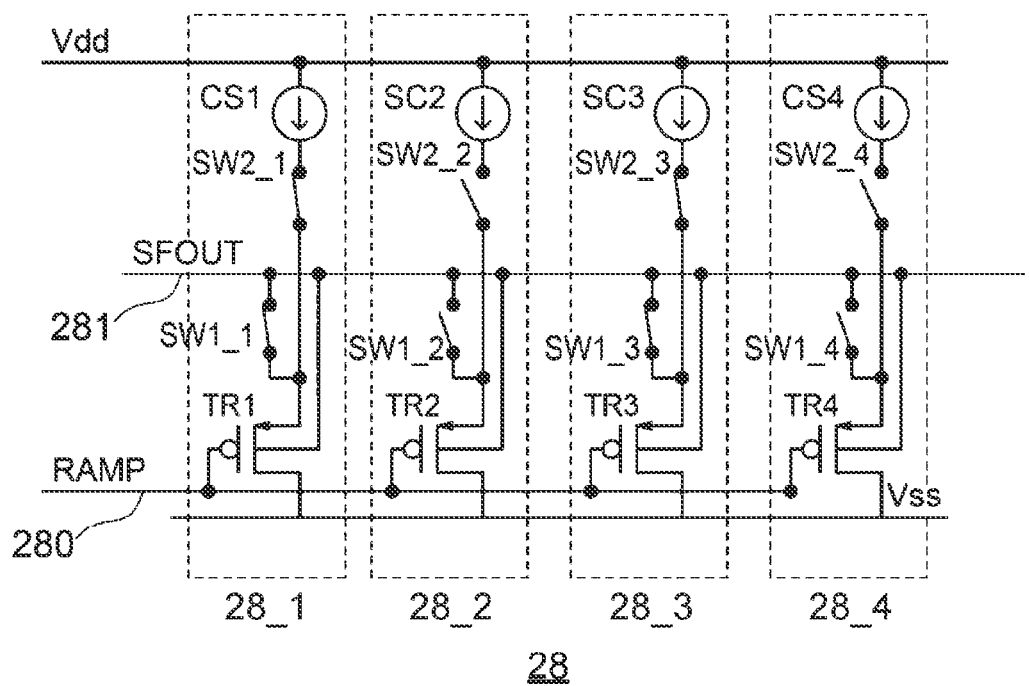
FIG. 6 is a circuit diagram illustrating an example of an internal configuration of a reference signal input circuit according to a second embodiment.

FIG. 6 is a circuit diagram illustrating an example of an internal configuration of a reference signal input circuit according to a second embodiment. The second embodiment is different from the first embodiment in that the back biases BB of the first transistors TR1 to TRn are electrically connected to the common output wiring 281. The other configurations of the second embodiment may be similar to the corresponding configurations of the first embodiment. In addition, the operations of the first and second switches SW1_1 to SW1_n and SW2_1 to SW2_n of the second embodiment may be similar to those of the first embodiment.

By commonly connecting the back biases BB of the first transistors TR1 to TRn to the common output wiring 281, the voltages of the back biases BB of the first transistors TR1 to TRn of all the columns become substantially equal to the voltage of the common output wiring 281. The common output wiring 281 is connected to the source of the first transistor TR (2k-1) via the first switch SW1_(2k-1) of the selected column, for example. Therefore, the voltage of the back bias BB of the first transistors TR1 to TRn is substantially equal to the source voltage of the first transistor TR (2k-1). Therefore, as described above, the linearity of the reference signal SFOUT with respect to the common reference signal RAMP is maintained.

Figure 7A:
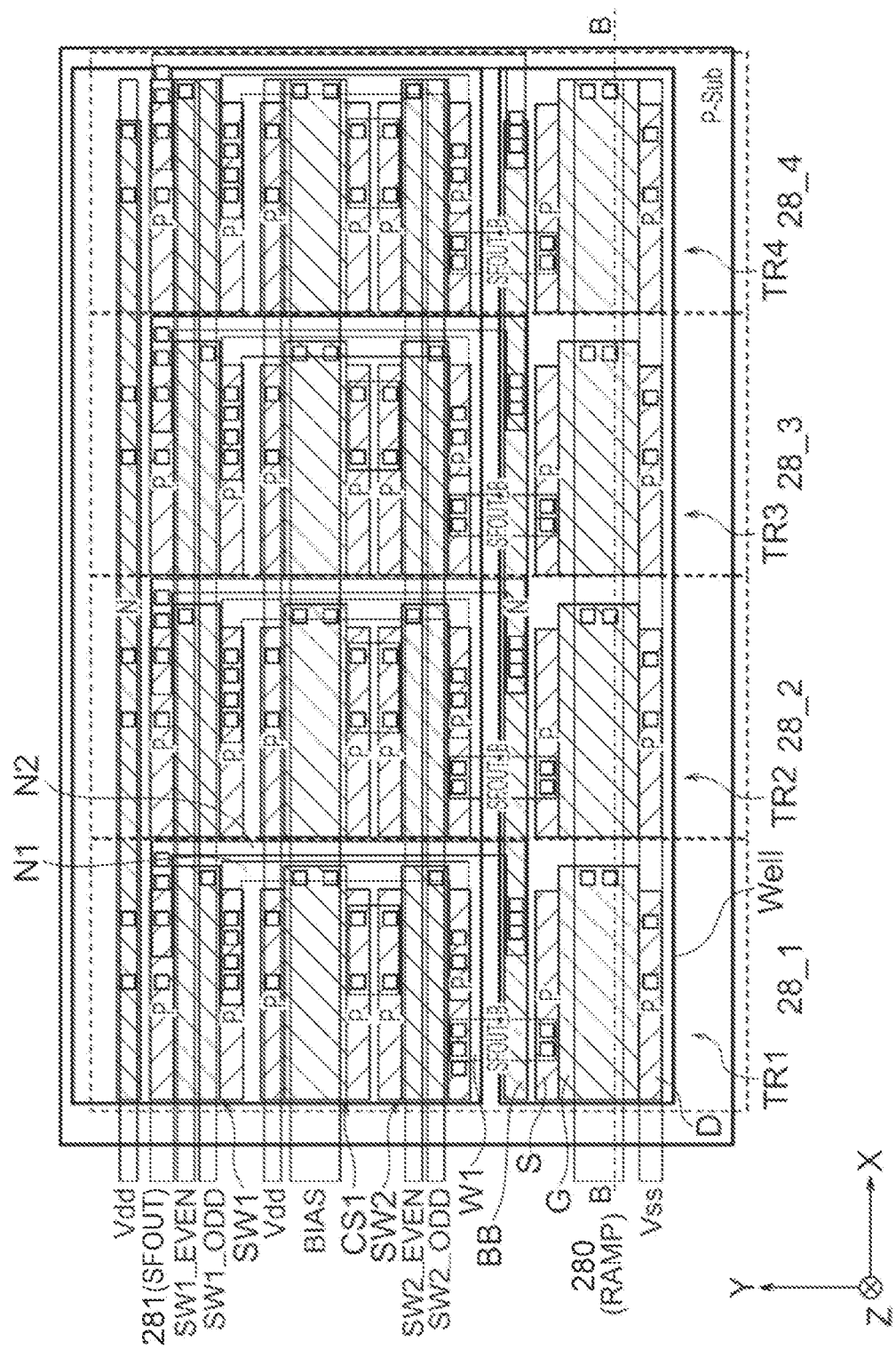
FIG. 7A is a plan view illustrating an example of a configuration of a reference signal input circuit according to the second embodiment.
Figure 7B:
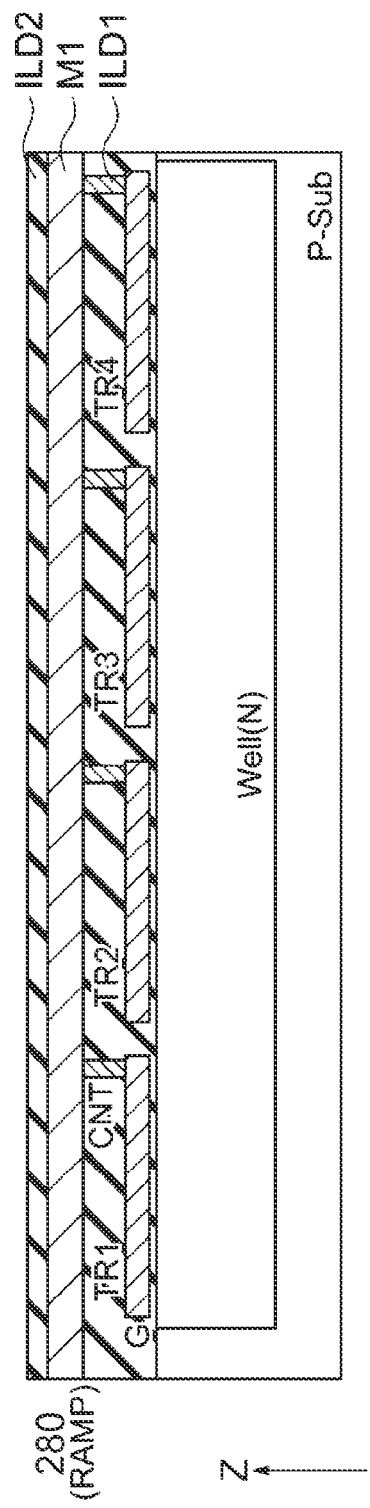
FIG. 7B is a schematic cross-sectional view taken along line B-B in FIG. 7A.

FIG. 7A is a plan view illustrating an example of a configuration of a reference signal input circuit according to the second embodiment. FIG. 7B is a schematic cross-sectional view taken along line B-B in FIG. 7A. The reference signal input circuits 28_1 to 28_4 have the same configuration as described above. Therefore, the configuration of the reference signal input circuit 28_1 will be described, and the detailed description of the configuration of the reference signal input circuit 28_2 to 28_4 will be omitted.

According to the second embodiment, the back biases BB of the first transistors TR1 to TRn are commonly connected to the common output wiring 281. Therefore, as illustrated in FIG. 7A, the node ND2 is connected between the back bias BB of the first transistor TR1 and the common output wiring 281. The node ND2 is a wiring formed by processing the second metal wiring layer M2.

In addition, since the back biases BB of the first transistors TR1 to TRn are commonly connected to the common output wiring 281, as illustrated in FIG. 7B, the first transistors TR1 to TR4 are formed in the same common N-type well region Well. Therefore, in the second embodiment, a well region corresponding to a column of each pixel column is unnecessary, and a common well region corresponding to a plurality of pixel columns or all pixel columns is provided. As a result, the interval between the first transistors TR1 to TRn can be narrowed, and the layout area of the reference signal input circuits 28_1 to 28_n can be reduced.

In addition, in the second embodiment, the semiconductor substrate is connected to the low voltage source Vss in another region (not illustrated). Therefore, in the second embodiment, the power supply line of the low voltage source Vss2 is unnecessary. Therefore, in the second embodiment, the layout area of the reference signal input circuit 28_1 to 28_n can be further reduced. Furthermore, in the reference signal input circuit 28_1 to 28_n, the sizes of the first transistors TR1 to TRn can be increased.

Other configurations and operations of the second embodiment may be similar to the corresponding configurations and operations of the first embodiment. Therefore, the second embodiment can also obtain similar effects to those of the first embodiment.

Third Embodiment

Figure 8:
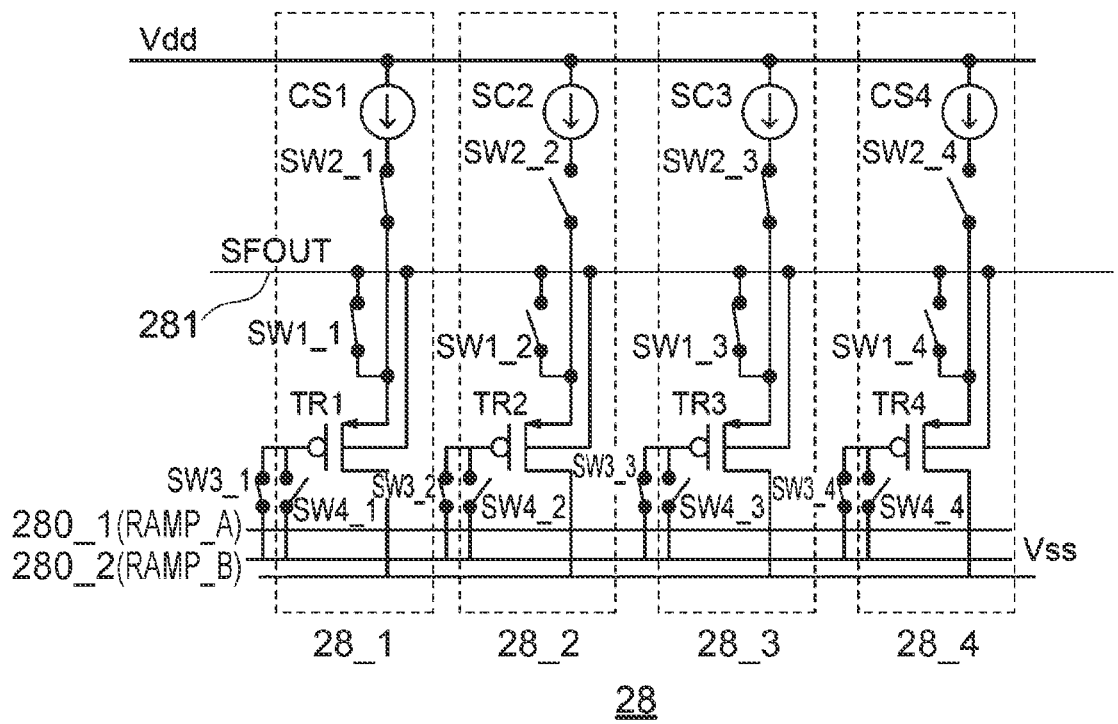
FIG. 8 is a circuit diagram illustrating an example of an internal configuration of a reference signal input circuit according to a third embodiment.

FIG. 8 is a circuit diagram illustrating an example of an internal configuration of a reference signal input circuit according to a third embodiment. In the solid-state imaging element 10 according to the third embodiment, a plurality of common input wirings 280_1 and 280_2 is provided corresponding to the first transistors TR1 to TRn of the plurality of reference signal input circuits 28_1 to 28_n, respectively. The common input wirings 280_1 and 280_2 transmit different common reference signals RAMP_A and RAMP_B, respectively. The common reference signals RAMP_A and RAMP_B start linear change from mutually different voltages, for example. Alternatively, the common reference signals RAMP_A and RAMP_B linearly change at different inclinations, for example.

One of the common reference signals RAMP_A and RAMP_B is supplied to the gates of the first transistors TR1 to TRn. For this purpose, third switches SW3_1 to SW3_n and fourth switches SW4_1 to SW4_n are provided. The third switches SW3_1 to SW3_n are connected between the common input wiring 280_1 and the gates of the first transistors TR1 to TRn, respectively. The fourth switches SW4_1 to SW4_n are connected between the common input wiring 280_2 and the gates of the first transistors TR1 to TRn, respectively. The third switches SW3_1 to SW3_n and the fourth switches SW4_1 to SW4_n are complementarily controlled to be turned on/off. Therefore, when the third switches SW3_1 to SW3_n are turned on, the fourth switches SW4_1 to SW4_n are turned off, and when the fourth switches SW4_1 to SW4_n are turned on, the third switches SW3_1 to SW3_n are turned off. Accordingly, one of the common reference signals RAMP_A and RAMP_B is input to the gates of the first transistors TR1 to TRn.

The third switches SW3_1 to SW3_n and the fourth switches SW4_1 to SW4_n are not necessarily provided in the reference signal input circuit 28, and may be provided outside. Therefore, the third switches SW3_1 to SW3_n and the fourth switches SW4_1 to SW4_n need not be displayed in the layout of the reference signal input circuit 28. Further, the planar layout of the third embodiment is a layout obtained by dividing the common input wiring 280 in FIG. 7A into two, and can be easily understood with reference to FIG. 7A. Therefore, illustration of the layout of the reference signal input circuit 28 according to the third embodiment is omitted.

Other configurations and operations of the third embodiment may be the same as the corresponding configurations and operations of the second embodiment. Therefore, the third embodiment can also obtain the effect of the second embodiment. In addition, the third embodiment may be combined with the first embodiment.

Fourth Embodiment

Figure 9:
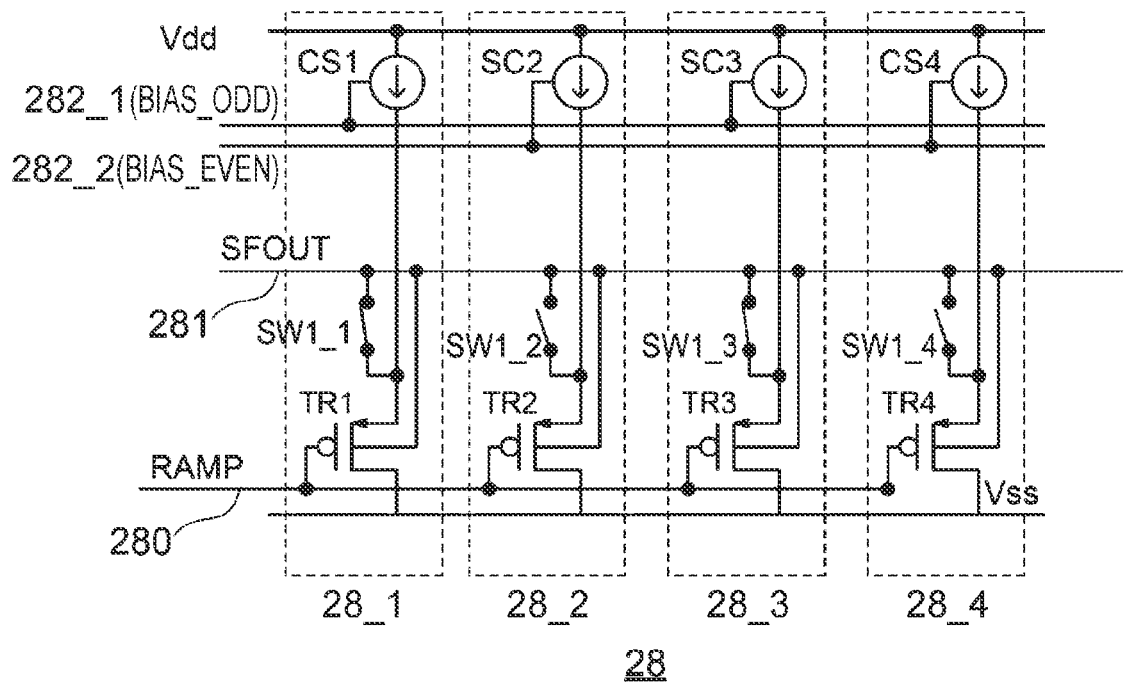
FIG. 9 is a circuit diagram illustrating an example of an internal configuration of a reference signal input circuit according to a fourth embodiment.

FIG. 9 is a circuit diagram illustrating an example of an internal configuration of a reference signal input circuit according to a fourth embodiment. The solid-state imaging element 10 according to the fourth embodiment further includes a first bias line 282_1 that applies the bias BIAS_ODD to some of the current sources CS (2k-1) among the current sources SC1 to CSn, and a second bias line 282_2 that applies the bias BIAS_EVEN to the other current source CS (2k). For example, the first bias line 282_1 is connected to the current source CS (2k-1) of the odd-numbered column, and supplies the bias BIAS_ODD to the current source CS (2k-1). The second bias line 282_2 is connected to the current source CS (2k) of the even-numbered column, and supplies the bias BIAS_EVEN to the current source CS (2k).

In this case, the second switches SW2_1 to SW2_$n$ may not be provided. For example, in a case where the current sources CS1 to CSn are low active, the bias BIAS_ODD is set to a predetermined low level, and the bias BIAS_EVEN is set to a high level. As a result, only the current sources CS (2k-1) of some reference signal input circuits 28_(2k-1) of the reference signal input circuits 28_1 to 28_$n$ supply a constant current to the first transistors TR (2k-1), and the current sources CS (2k) of the other reference signal input circuits 28_(2k) do not supply a current to the first transistors TR (2k). As a result, the fourth embodiment can perform a similar operation to that of the second embodiment.

Figure 10:
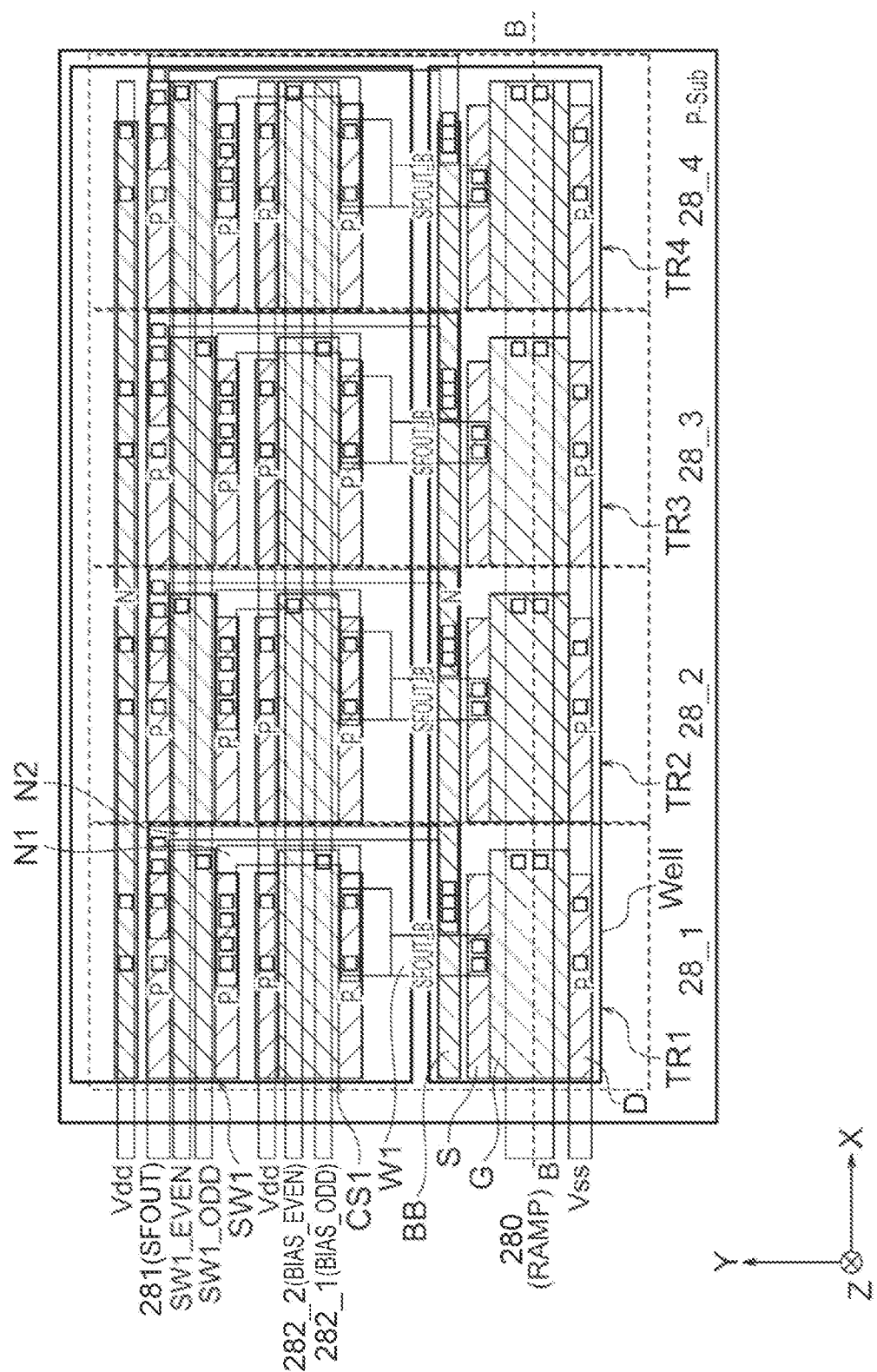
FIG. 10 is a plan view illustrating an example of a configuration of a reference signal input circuit according to the fourth embodiment.

FIG. 10 is a plan view illustrating an example of a configuration of a reference signal input circuit according to the fourth embodiment. The cross section taken along line B-B in FIG. 10A may be the same as that in FIG. 7B of the second embodiment. According to the fourth embodiment, the bias lines for driving the current sources CS1 to CSn are divided into first and second bias lines 282_1 and 282_2. The first bias line 282_1 is connected to the current source CS (2k-1) of the reference signal input circuit 28_(2k-1) corresponding to the odd-numbered pixel column. The first bias line 282_1 applies a bias BIAS_ODD to the current source CS (2k-1) during operation of the reference signal input circuit 28_(2k-1). The second bias line 282_2 is connected to the current source CS (2k) of the reference signal input circuit 28_(2k) corresponding to the even-numbered pixel column. The second bias line 282_2 applies the bias BIAS_EVEN to the current source CS (2k) during the operation of the reference signal input circuit 28_(2k).

Since the bias line is divided into the first and second bias lines 282_1 and 282_2, the second switch SW2 is omitted. As a result, the layout area of the reference signal input circuit 28_1 to 28_$n$ can be reduced.

Other configurations and operations of the fourth embodiment may be the same as the corresponding configurations and operations of the second embodiment. As a result, the fourth embodiment can also obtain similar effects to those of the second embodiment. In addition, the fourth embodiment may be combined with the first embodiment.

Figure 11:
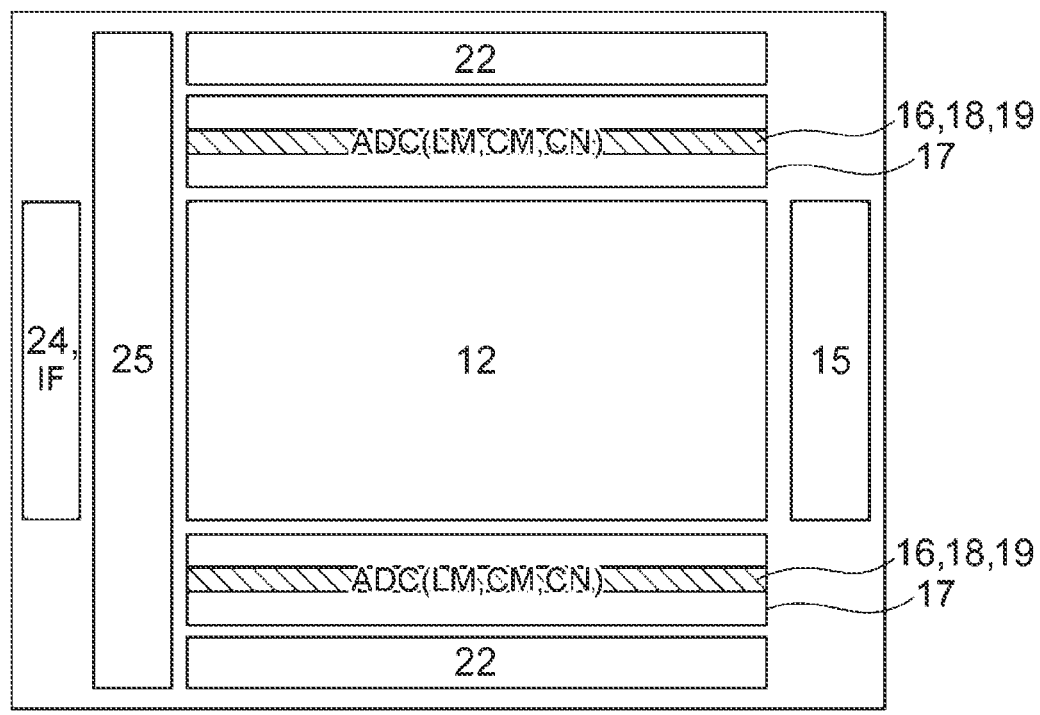
FIG. 11 is a schematic plan view illustrating a configuration example of a semiconductor chip of a solid-state imaging element to which the present technology is applied.
Figure 12:
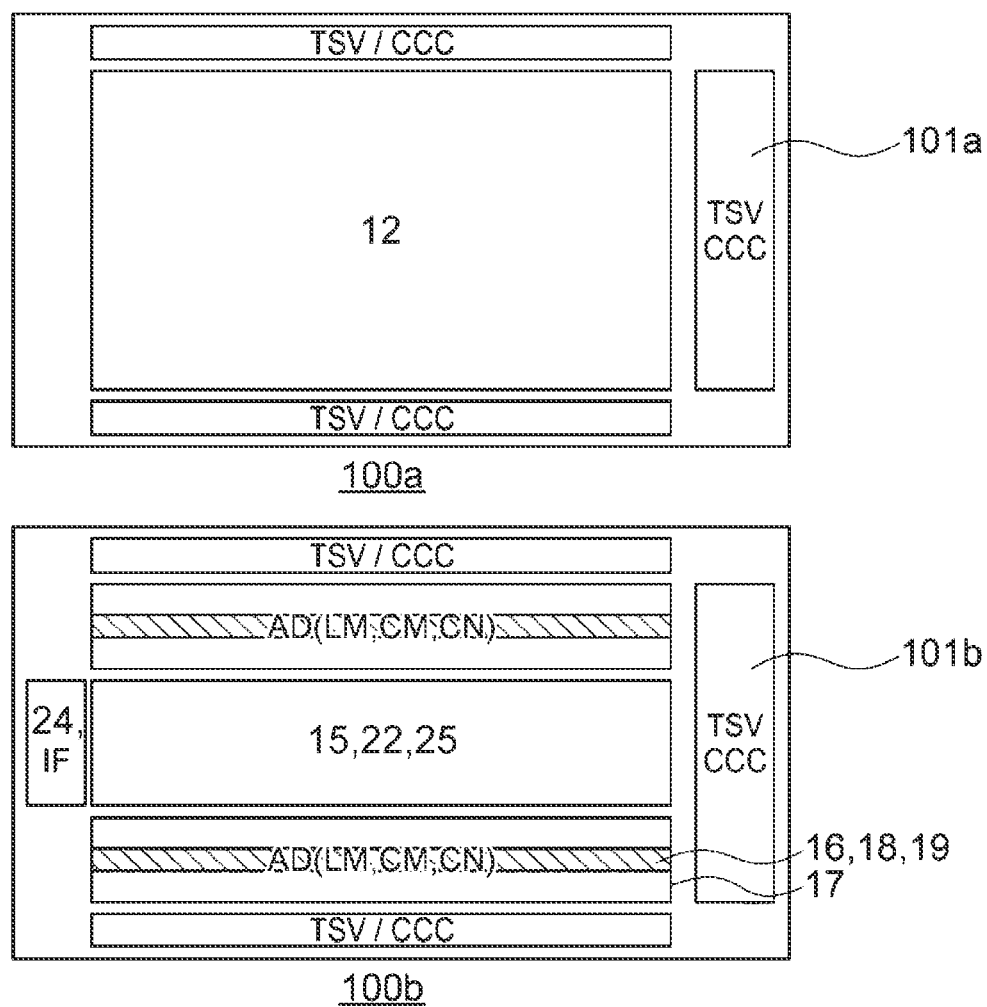
FIG. 12 is a schematic plan view illustrating a configuration example of a semiconductor chip of a solid-state imaging element to which the present technology is applied.

FIGS. 11 and 12 are schematic plan views illustrating a configuration example of a semiconductor chip of a solid-state imaging element to which the present technology is applied. FIG. 11 illustrates an embodiment in which the pixel array unit 12 and the peripheral circuit are configured as one chip. FIG. 12 illustrates an embodiment in which the pixel array unit 12 and the peripheral circuit are configured as separate chips.

As illustrated in FIG. 11, the solid-state imaging element 10 may be configured as one chip. In this case, the pixel array unit 12, the row scanning circuit 15, the column scanning circuit 22, the column processing unit 17, the timing control circuit 25, and the signal processing circuit 24 are formed on one semiconductor chip. The column processing unit 17 includes the ADC 16, the DAC 18, and the counter 19 according to the above embodiment.

Furthermore, as illustrated in FIG. 12, the solid-state imaging element 10 may be configured by stacking a semiconductor chip 100a including the pixel array unit 12 and a semiconductor chip 100b including other peripheral circuits. In this case, the row scanning circuit 15, the column scanning circuit 22, the column processing unit 17, the timing control circuit 25, and the signal processing circuit 24 are formed on a semiconductor chip 100b different from the semiconductor chip 100a of the pixel array.

The semiconductor chips 100a and 100b may be electrically connected using, for example, a through electrode such as a through silicon via (TSV) provided in a via region 101a and a via region 101b or the like. Further, in the semiconductor chips 100a, 100b, for example, both the semiconductor chips 100a, 100b may be bonded to each other so that the Cu wiring of the semiconductor chip 100a and the Cu wiring of the semiconductor chip 100b are brought into contact with each other (Cu—Cu bonding). Note that a part of the peripheral circuit may be configured as a semiconductor chip, and other configurations may be configured as another semiconductor chip. In addition, the number of stacked semiconductor chips may be three or more.

Application Example to Mobile Body

The technology according to an embodiment of the present disclosure (present technology) can be applied to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a boat, a robot, and the like.

Figure 13:
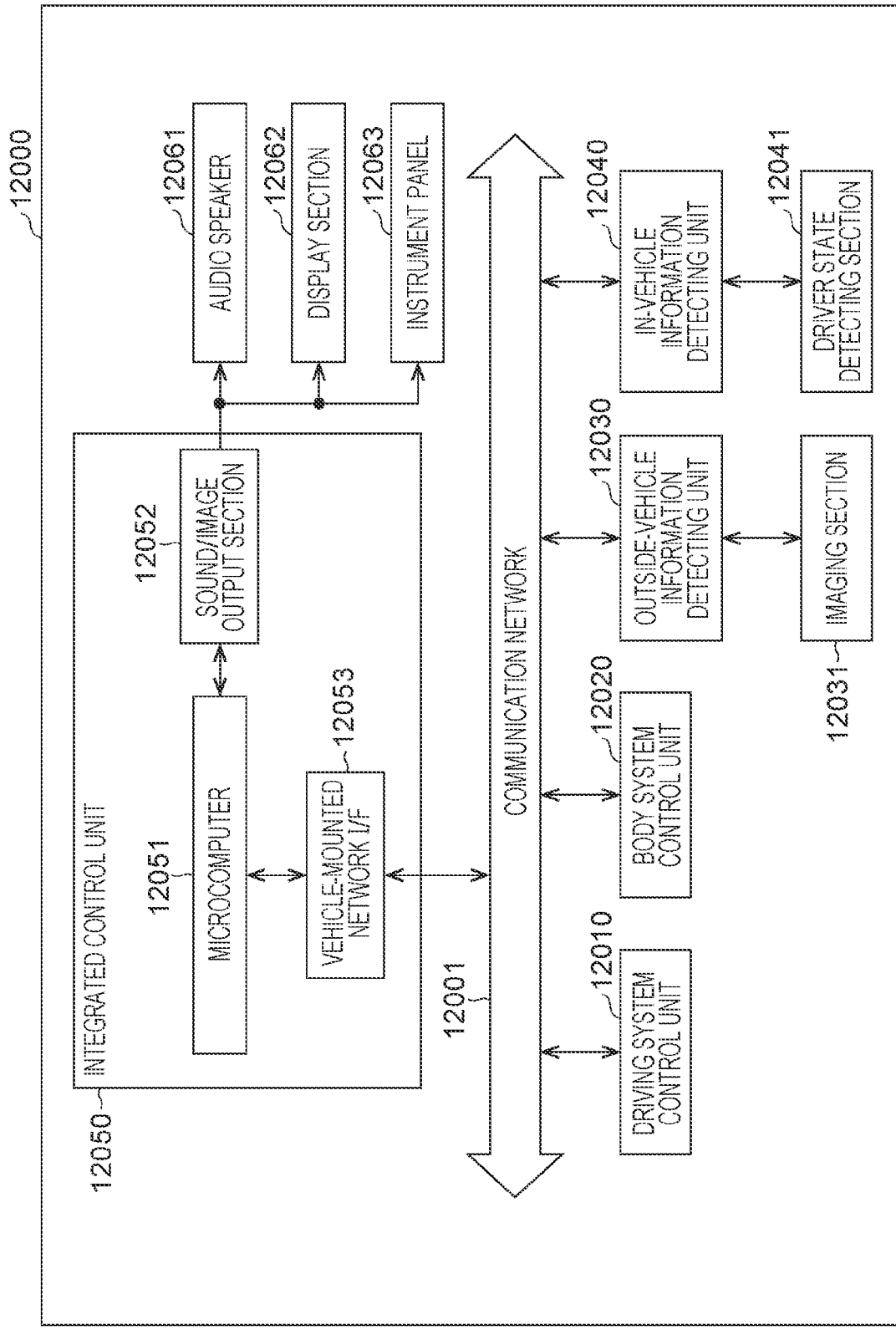
FIG. 13 is a block diagram illustrating a schematic configuration example of a vehicle control system being an example of a mobile body control system to which the technology according to the present disclosure is applicable.

FIG. 13 is a block diagram illustrating a schematic configuration example of a vehicle control system being an example of a mobile body control system to which the technology according to the present disclosure is applicable.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
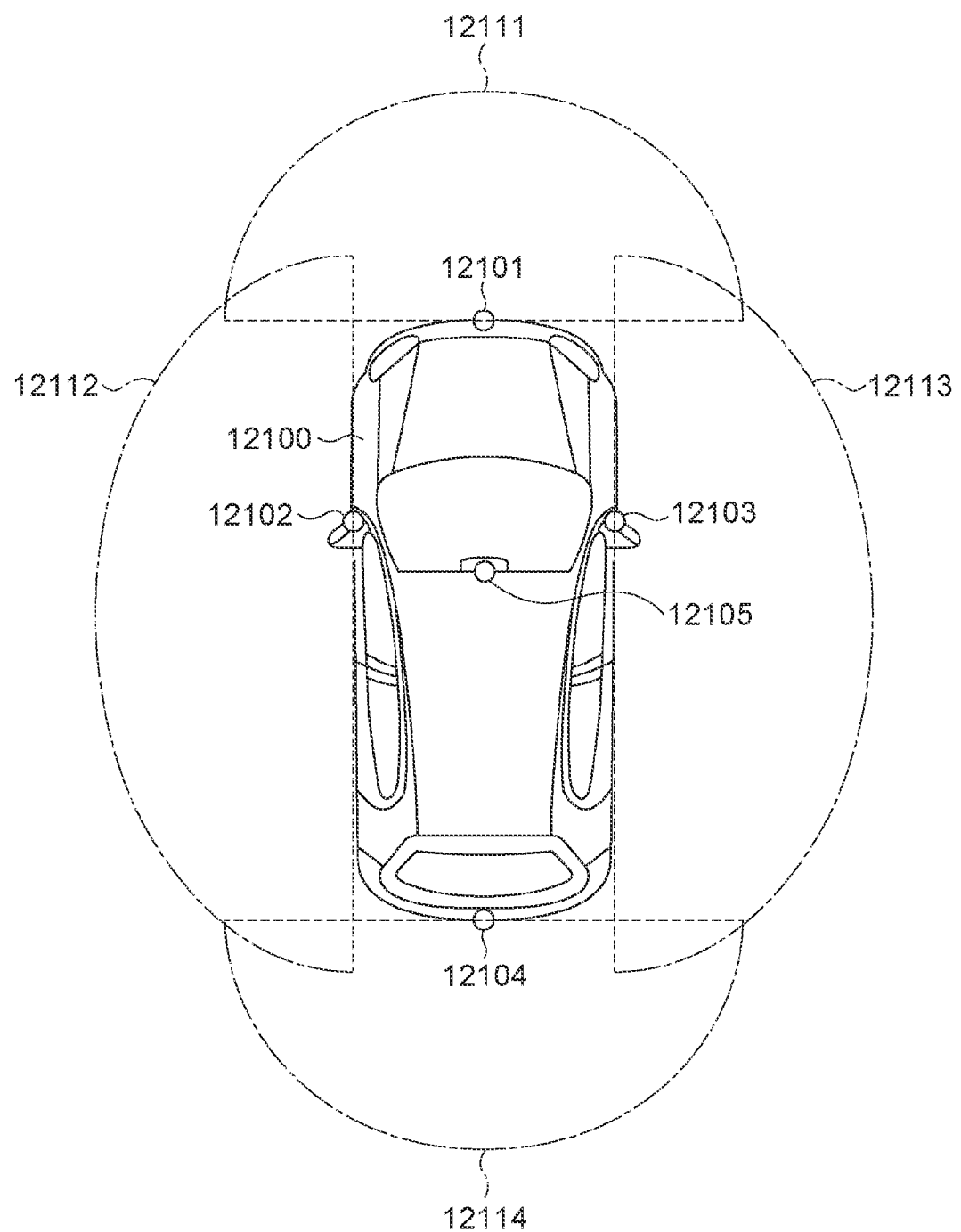
FIG. 14 is a diagram depicting an example of the installation position of the imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Note that the present disclosure is not limited to the above-described embodiments, and various modifications can be made without departing from the gist of the present disclosure. Furthermore, the effects described in the present specification are merely examples and are not limited, and other effects may be provided.

An example of the vehicle control system to which the technology according to an embodiment of the present disclosure can be applied has been described above. The technology according to an embodiment of the present disclosure can be applied to the imaging section 12031 among the configurations described above.

Note that the present technology can have the following configurations.

(1)

A solid-state imaging element including:
a plurality of comparators that is provided corresponding to a plurality of pixel columns each including an array of a plurality of pixels that photoelectrically converts light and outputs a pixel signal, and compares the pixel signal with a reference signal;
a reference signal generation unit that generates a common reference signal used to generate the reference signal, and a plurality of input circuits respectively corresponding to the plurality of pixel columns and provided between the plurality of comparators and the reference signal generation unit;
a common input wiring through which the common reference signal is input to the plurality of input circuits; and
a common output wiring that outputs the reference signal from the plurality of input circuits to the plurality of comparators,
in which each of the plurality of input circuits includes:
a first transistor having a gate connected to the common input wiring; and
a first switch connected between a source of the first transistor and the common output wiring.

(2)

The solid-state imaging element according to (1), in which a back gate and the source of the first transistor are electrically connected.

(3)

The solid-state imaging element according to (1), in which a back gate of the first transistor and the common output wiring are electrically connected.

(4)

The solid-state imaging element according to (1) or (2),
in which the first transistor of each of the plurality of input circuits is provided in a different well diffusion layer, and
the source of the first transistor is electrically connected to the well diffusion layer in which the first transistor is provided.

(5)

The solid-state imaging element according to (1) or (3),
in which a plurality of the first transistor of the plurality of input circuits is provided in a same common well diffusion layer, and
the common output wiring is electrically connected to the common well diffusion layer.

(6)

The solid-state imaging element according to any one of (1) to (5), in which the first switch of an input circuit of the plurality of input circuits corresponding to a selected part of the plurality of pixel columns is turned on.

(7)

The solid-state imaging element according to any one of (1) to (6),
in which each of the plurality of input circuits includes:
a current source that supplies a current to the source of the first transistor; and
a second switch connected between the source of the first transistor and the current source.

(8)

The solid-state imaging element according to (7), in which the second switch of an input circuit of the plurality of input circuits corresponding to a selected part of the plurality of pixel columns is turned on.

(9)

The solid-state imaging element according to (7), in which in each of the plurality of input circuits, the second switch is in an on state when the first switch is in an on state, and the second switch is in an off state when the first switch is in an off state.

(10)

The solid-state imaging element according to any one of (1) to (9), in which a plurality of the common input wiring is provided corresponding to the first transistor of each of the plurality of input circuits, and transmits common reference signals having different voltages.

(11)

The solid-state imaging element according to any one of (1) to (6) and (9),
in which a first input circuit among the plurality of input circuits includes:
a first current source that supplies a first current to the source of the first transistor; and
a first bias line that is connected to the first current source and provides a first bias corresponding to the first current to the first current source, and
a second input circuit among the plurality of input circuits includes:
a second current source that supplies a second current to the source of the first transistor; and
a second bias line that is connected to the second current source and provides a second bias corresponding to the second current to the second current source.

(12)

The solid-state imaging element according to any one of (1) to (5), in which the first switch of an input circuit of the plurality of input circuits corresponding to a first pixel column intermittently selected among the plurality of pixel columns is turned on, and the first switch of an input circuit of the plurality of input circuits corresponding to a second pixel column other than the first pixel column is turned off.

(13)

The solid-state imaging element according to any one of (7) to (9), in which the second switch of an input circuit of the plurality of input circuits corresponding to a first pixel column intermittently selected among the plurality of pixel columns is turned on, and the second switch of an input circuit of the plurality of input circuits corresponding to a second pixel column other than the first pixel column is turned off.

(14)

The solid-state imaging element according to any one of (1) to (13), in which an input circuit of the plurality of input circuits is a source follower circuit.

REFERENCE SIGNS LIST

10 Solid-state imaging element
12 Pixel array unit
15 Row scanning circuit
17 Column processing unit
18 Reference signal generation unit
19 Counter
22 Column scanning circuit
24 Signal processing circuit
25 Timing control circuit
28 Reference signal input circuit
20 Comparator
280 Common input wiring
281 Common output wiring
TR1 to TRn First transistor
SW1_1 to SW1_n First switch
SW2_1 to SW2_n Second switch
CS1 to CSn Current source

The invention claimed is:

1. A solid-state imaging element, comprising:
a pixel array that includes a first pixel and a second pixel, wherein
the first pixel is configured to output a first pixel signal, and
the second pixel is configured to output a second pixel signal;
a reference signal generation unit configured to generate a common reference signal;
a first reference signal input circuit configured to supply a first reference signal;
a second reference signal input circuit configured to supply a second reference signal;
a first comparator configured to compare the first pixel signal with the first reference signal; and
a second comparator configured to compare the second pixel signal with the second reference signal, wherein
the first reference signal input circuit is coupled to the reference signal generation unit via a common input wiring,
the first reference signal input circuit is configured to receive the common reference signal from the reference signal generation unit,
the second reference signal input circuit is coupled to the reference signal generation unit via the common input wiring,
the second reference signal input circuit is configured to receive the common reference signal from the reference signal generation unit,
the first reference signal input circuit is coupled to the first comparator via a common output wiring,
the first reference signal input circuit is configured to supply the first reference signal to the first comparator,
the second reference signal input circuit is coupled to the second comparator via the common output wiring,
the second reference signal input circuit is configured to supply the second reference signal to the second comparator,
the first reference signal input circuit includes a first transistor, a first switch, and a first current source,
the second reference signal input circuit includes a second transistor, a second switch, and a second current source,
a gate of the first transistor is coupled to the common input wiring,
a source of the first transistor is coupled to the common output wiring,
the first switch is coupled between the source of the first transistor and the first current source,
a gate of the second transistor is coupled to the common input wiring,
a source of the second transistor is coupled to the common output wiring, and
the second switch is coupled between the source of the second transistor and the second current source.

2. The solid-state imaging element according to claim 1, wherein the reference signal generation unit is further configured to supply the common reference signal to a plurality of reference signal input circuits.

3. The solid-state imaging element according to claim 1, wherein the common reference signal is for a generation of a reference signal for a detection of a voltage level of the first pixel signal.

4. The solid-state imaging element according to claim 1, wherein the first reference signal input circuit includes a source follower circuit.

5. The solid-state imaging element according to claim 1, wherein the first reference signal input circuit is configured to separate the common input wiring and the common output wiring.

6. The solid-state imaging element according to claim 1, wherein the first transistor is a P-type MOS transistor.

7. The solid-state imaging element according to claim 1, further comprising a memory configured to store a count value in response to the comparison of the first pixel signal with the first reference signal.

8. The solid-state imaging element according to claim 1, further comprising a timing control circuit configured to control the second switch based on a control signal.

* * * * *